United States Patent
Steegmueller et al.

(10) Patent No.: US 6,797,940 B2
(45) Date of Patent: Sep. 28, 2004

(54) OPTICAL ENCODER WITH TRIPLE PHOTODIODE

(75) Inventors: Ulrich Steegmueller, Regensburg (DE); Stefan Groiss, Villach (AT); Frank Moellmer, Matting b. Pentlin (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 319 days.

(21) Appl. No.: 09/751,932

(22) Filed: Dec. 29, 2000

(65) Prior Publication Data

US 2001/0030282 A1 Oct. 18, 2001

(30) Foreign Application Priority Data

Dec. 30, 1999 (DE) .......................................... 199 63 809

(51) Int. Cl.[7] .................................................. G01D 5/34
(52) U.S. Cl. ................................................ 250/231.13
(58) Field of Search ....................... 250/231.13–231.18, 250/208.18, 237 R, 237 G; 356/616–619; 341/9–13

(56) References Cited

U.S. PATENT DOCUMENTS

| | | | |
|---|---|---|---|
| 4,654,525 A | | 3/1987 | Ebina et al. |
| 4,691,101 A | | 9/1987 | Leonard |
| 6,465,772 B1 | * | 10/2002 | Nelson et al. ......... 250/231.15 |
| 6,563,108 B1 | * | 5/2003 | Stevens et al. ........ 250/231.13 |
| 6,630,659 B1 | * | 10/2003 | Stridsberg ............... 250/231.13 |

FOREIGN PATENT DOCUMENTS

DE 43 18 386 A1 3/1995

* cited by examiner

Primary Examiner—Tu T. Nguyen
(74) Attorney, Agent, or Firm—Cohen, Pontani, Lieberman & Pavane

(57) ABSTRACT

The present invention relates to an optical encoder for measuring the speed and direction of a moving raster. The raster may be moving linearly or angularly and may further be connected to a moving element, such as a spinning shaft, of which speed and orientation measurement Is sought. The raster may comprise a slit plate or the like and include many formations in sequence. The formations may be successively opaque and transparent to light. The raster modulates light from a light source and the modulated light is detected by at least one set of three photodetectors. Output of the photodetectors is then used to generate a reference signal to which individual outputs are compared. The results of the comparisons are indicative of the speed and direction of the raster and moving element to which the raster is attached. The at least one set of three photodetectors are oriented such that the combined lengths of the light receiving areas of the set of three photodetectors is between one half and one period of the raster. The photodetectors and evaluating circuitry used to process their output may be semiconductor components on a single substrate.

18 Claims, 2 Drawing Sheets

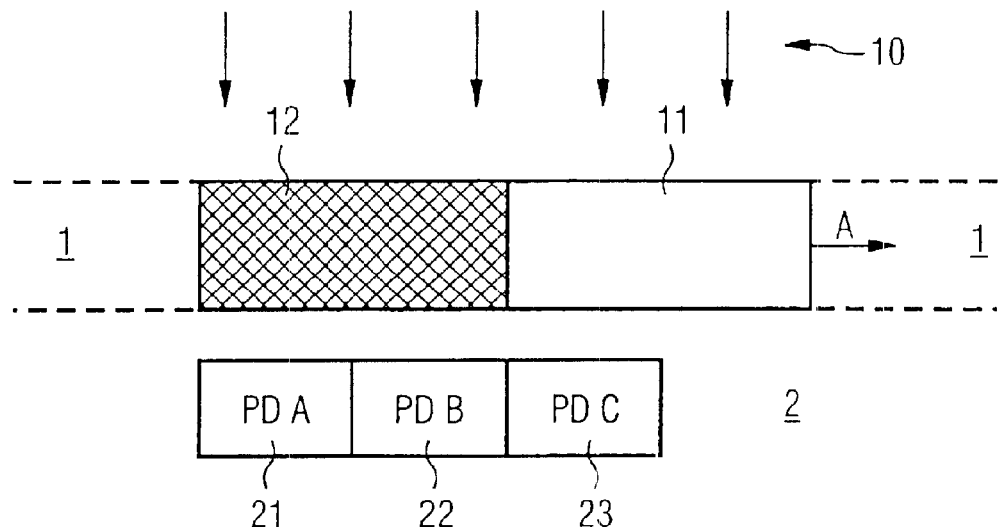
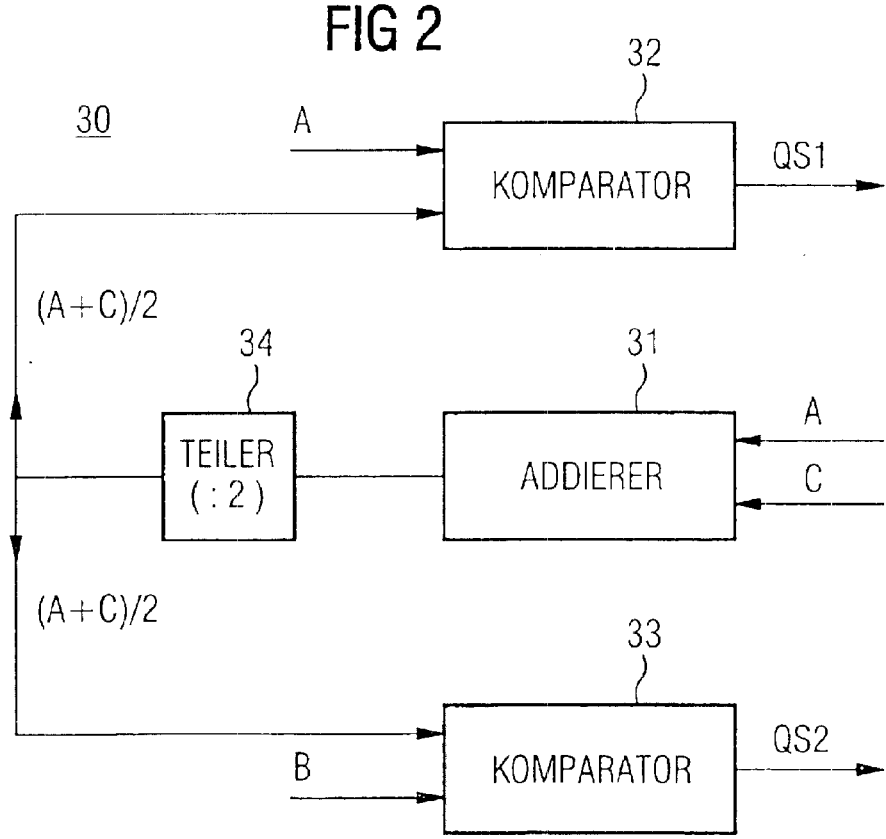

OPTICAL ENCODER WITH TRIPLE PHOTODIODE

BACKGROUND OF THE INVENTION

The present invention generally relates to optical encoders and more particularly to optical encoders for measuring and analyzing rotary and linear motions. The present invention includes a linear formation of three photodiodes for detecting light passing through a raster, wherein the photodiodes are also specifically spaced from the raster.

Optical encoders function to register rotary angular motion or linear motion as well as direction of a moving body. Encoders generally comprise a light emitting system; a slit plate, raster or scattering arrangement, plate, sheet, or ruler (herein referred to as a raster); and a detecting arrangement positioned to receive light reflected off of or passing through the raster arrangement. The raster is attached to a rotating body, such as a shaft, for which the speed and direction are sought. The emitting system generally comprises a light emitting diode or laser diode with a lens arrangement optically coupled thereto. A light bundle may also be used to transport the light from the source to the raster arrangement. The detecting arrangement detects the light as modulated by the raster and generates information in response to the detection. The information is indicative of the speed and direction of the shaft to which the raster is connected.

In current encoders, the detecting arrangement is made or otherwise arranged to be evenly illuminated. Four photodiodes are typically employed and evaluation logic is electronically coupled to the detecting arrangement. The photodiodes are arranged linearly and parallel or tangential to the raster arrangement. The space between the photodiodes are one quarter of the raster arrangement period. The signals generated by adjacent photodiodes are phase shifted by ninety degrees respectively. The evaluation logic then determines the linear or angular speed of the raster arrangement based on the output of the photodiodes.

U.S. Pat. No. 4,654,525 sets out an optical encoder arrangement for detecting rotational movement of a circular raster. The raster Is concentrically arranged about a central axis and includes periodical openings moving between a light source and a linear array of four photodiodes. The photodiodes thus detect the rotational motion of the raster by analysis of light passing through the raster openings and made incident upon the photodiodes. The opening within the raster is formed in such a way that the width of opaque or transparent areas corresponds to the combined lengths of two adjacent photodiodes and spacing therebetween. By this arrangement, four adjacent signals are produced by the photodiodes, except that the signals are each out of phase by ninety degrees thereby producing an quadrature signal. The quadrature signals are fed passed adders and comparators so as to arrive at two quadrature signals out of phase by ninety degrees. The two signals are indicative of the rate and phase proportion of the rotary direction and speed of the raster.

U.S. Pat. No. 4,691,101 sets out a similar optical encoder. Herein several linear arrays of four photodiodes are successively arranged and the output of those diodes, in phase, are further electrically coupled. Alternative arrangement schemes are set out for arrangement of the photodiodes.

BRIEF SUMMARY OF THE INVENTION

Heretofore, it is a given in the art that four semiconductor photodiodes are to be employed in an optical encoder. The area of each photodiode (along with some spacing) is set to half the area of the opening within the raster and further separately electrically biased. As such, this arrangement entails high manufacturing and engineering costs as well as high consumption of semiconductor chip area.

Accordingly, it is an object of the present invention to set out an optical encoder for detection and analysis of linear or angular motions which can be produced at reduced engineering and manufacturing costs, be designed for high replication, require reduced area of the semiconductor chip area, while still remaining relatively immune to light intensity fluctuations.

These and other objects of the present invention are accomplished by an optical encoder comprising light emitting means for generating light; a raster for modulating said generated light, said raster comprising a plurality of periodically positioned first and second formations, said first formations being opaque and said second formations being transparent, and said raster being attached to a moving element; light detection means for detecting light modulated by said raster, said light detection means comprising at least one set of three light detecting elements having light receiving areas being positioned in parallel to said raster, said elements generating an output responsive to detected light; and evaluating means electrically coupled to said detecting elements, said evaluating means comprising evaluating elements for receiving said detecting means output and generating an evaluating means output indicative of speed and direction of moving element.

The optical encoder according to the present invention includes three photodiodes. Herein, a reference signal is produced by a suitable evaluation circuit and used to compensate for light intensity fluctuations. The circuit includes an adder which receives the output of the first and third photodiodes. A signal level reduction component is connected to the output of the adder so as to produce a reference signal at its output. The reference signal is then fed into at least two comparators which compare the reference signal with the output of the first and second photodiodes. The outputs of the comparators are quadrature signals which are indicative of the angular speed and direction of the raster. In addition, the signals are out of phase by ninety degrees. The signal level reduction means may be a divider, lowering the adder output by a factor of two. Fluctuations of light intensity do not adversely effect the measuring capability of the present arrangement.

The present arrangement also employs sets of three photodetectors in place of the four used in the prior art. The photodetectors, which may comprise photodiodes, are spaced apart, such that the length of two light receiving areas of two adjacent photodiodes is about the same as a length of an opaque or transparent formation in the raster. The combined length of the light receiving areas may correspond to half or three quarters of the period of the raster. Given the linear arrangement of the photodetectors, the compact space advantage of the prior art is preserved. Likewise, the at least one set of three photodetectors may be arranged on a single substrate with the circuitry for the evaluation step formed thereon or therein. One advantage over the prior art lay in the reduction of at least one photodiode (from four to three), thereby resulting in decreased manufacturing and engineering costs. Additional advantages will become clear from the continued description of the present invention below.

BRIEF DESCRIPTION OF THE SEVERAL VIEWS OF THE DRAWINGS

The novel features believed characteristic of the invention are set out in the claims below. The invention itself, however, as well as other features and advantages thereof, are best understood by reference to the detailed description, which follows, when read in conjunction with the accompanying drawings, wherein:

FIG. 1 depicts a schematic representation of the present invention;

FIG. 2 depicts an arrangement of an evaluation circuit;

DETAILED DESCRIPTION OF THE PREFERRED EMBODIMENT

Figure 3:
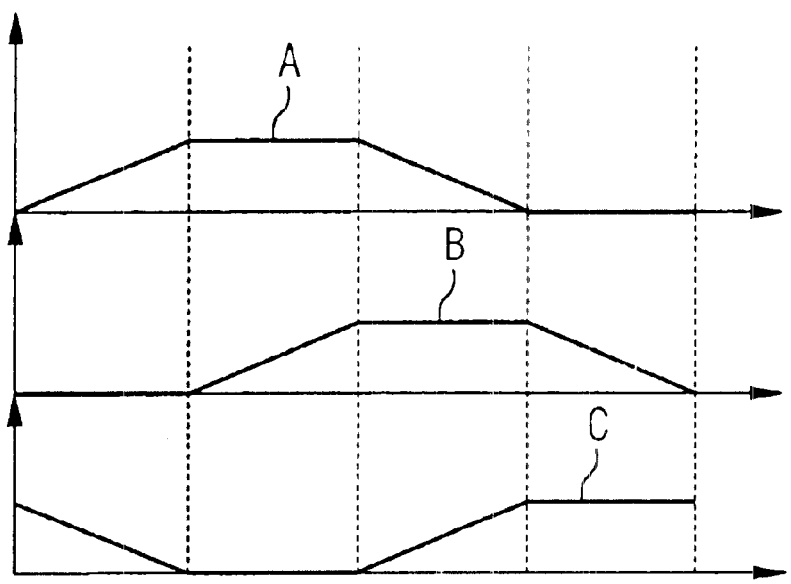
FIG. 3 depicts a graphical representation of the signal output of the instant three diodes.

FIG. 1 depicts a schematic representation of the present invention. Herein a light bundle 10 coming from a light source (not shown) is depicted. The light source may comprise a light emitting diode, laser diode, vertical resonator light emission device such as a vertical cavity surface emitting laser (VCSEL), edge emitting semiconductor laser, or other light generating means known to one skilled in the art. Where a VCSEL is used, an advantage of low emission divergence and high light density may be achieved. The output of the light source may be made parallel by an optically coupled lens prior to irradiance to the raster. As such, the light is made to evenly irradiate upon a raster 1, a raster disc or a raster ruler, positioned proximate to the light source. The raster may be attached to a linear moving or rotating object_or the like whose speed and direction are desired to be measured. The raster 1 comprises a periodic raster pattern made of transparent portions 11 and opaque portions 12. The portions are preferably about the same in length, the length running in the direction of motion of the raster. Preferably the portions having an equal size in lateral direction.

The movement of the raster, direction indicated by arrow A, modulates the light from the light bundle as the light either passes through the transparent portions 11 or is blocked by the opaque portions 12. Positioned on the side of the raster opposite from the light bundle are three photodiodes: first photodiode 21, second photodiode 22, and third photodiode 23. The present embodiment depicts a single set of three photodiodes. However, other embodiments may include more than one set of three photodiodes. The photodiodes are independently operated. Their light receiving areas may be arranged adjacently and in parallel to the raster. The combined length of the photodiode detecting areas spans three quarters of the period of the raster. The combined length of two adjacent photodiode detecting areas spans the length of one portion (transparent or opaque) of the raster. As shown in FIG. 1, first and second photodiodes span the length of opaque portion 12. Third photodiode 23 lies entirely below transparent portion 11.

Skipping to FIG. 3, herein the output of the three photodetectors is depicted (40). The common ordinate 41 of the graphs relate to time while the abscissa 43, 45 and 47 relate to signal strength as related to the amount of incident light detected by the photodiode. First graph 42 relates to the output of first photodiode 21. Second graph 44 relates to the output of second photodiode 22. Third graph 46 relates to the output of third photodiode 23. The graphs depict a typical scan where the raster is irradiated with evenly distributed light of an intensity relatively equal in strength as with respect to the three photodiodes. It is within the scope of the invention that other light strengths may be employed as well as appropriate elements in the evaluation means (to be discussed in more detail below) to compensate for the same. As a transparent portion 11 moves across a raster thereby exposing more of the light detecting area of the photodiode to the light from the optical bundle, the rise in signal output power of each photodiode will be relatively the same. As such, each rise in power is depicted by a common rising graph segment 48. As the full area of the photodetector light receiving area is exposed to light, the output power of the photodetector remains constant, as depicted by graph segment 50. As the light on the photodetector light receiving area falls due to the cutting off of light as effected by the on-coming opaque portion 12, the output power of the photodetector falls, consistently, as depicted by falling graph segment 52. A period of the raster is depicted on graph 40 by dashed lines 51, 53, 55, and 57. As shown, each photodetector becomes fully exposed (50) at different successive times.

The present invention takes advantage of the inverse power relationship between first and third photodetectors 21 and 23, graphs 42 and 46. This relationship is exploited to generate the reference signal which is relatively immune to light power fluctuations as will be detailed below.

Returning to FIG. 2, the figure depicts an embodiment of an evaluation circuit to be employed by the present invention. Equivalent elements and arrangements may be employed, as would be known by the skilled artisan, to accomplish the equivalent signal manipulation and output as will be set out below. Applying the arrangement depicted in FIG. 2, the output from the first and third photodetectors are feed into an adder 31 which combines the two inputs into an output. The output represents about twice the maximum output of one of the photodetectors. The output of adder 31 is fed into divider 34 which divides the signal from the adder by two. The output of the divider serves as a reference signal as it remains relatively insensitive to fluctuations in light intensity given the inverse relationship between the first and third photodetectors as depicted in FIG. 2. The reference signal is fed into a first and second comparator 32 and 33. The first comparator 32 is fed the output A from the first photodetector 21 and outputs first quadrature signal QS1. Likewise, the second comparator 33 is fed the output B from second photodetector 22 and outputs second quadrature signal QS2. The pulse rate of the two quadrature signals are indicative of the speed of the raster, while the phase of the two signals is indicative of the raster direction.

Figure 4:
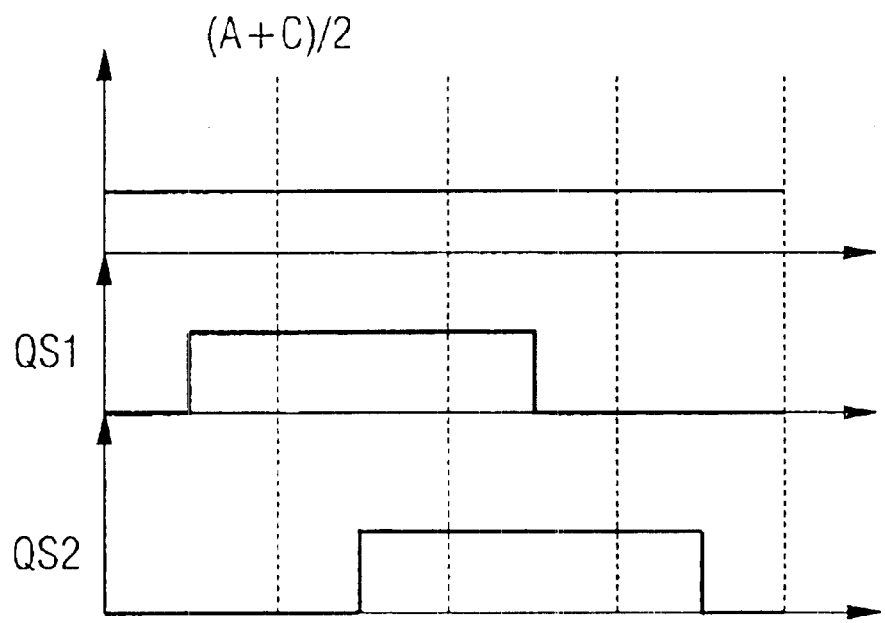
FIG. 4 depicts a reference signal and two quadrature signals as produced by the evaluation circuit based on output from the three photodiodes.

FIG. 4 is a graphical representation of the two quadrature signals, QS1 and QS2, as well as the reference signal. In particular, the common ordinate of the graphs 62 represents binary expressions of 0 and 1 (high or low) while the various abscissa 64, 66, and 68 of graphs 70, 72 and 74, indicate time. The period of the raster is again broken down by quarters, 61, 63, 65 and 67. The reference signal 69, as depicted in graph 70 remains constant given the inverse relationship of the first and third photodetectors. The first quadrature signal QS1 remains at low or 0 so long as the output of the first photodiode 21 is smaller than the reference signal as determined by comparator 32. As soon as the output of the first photodetector 21 rises above the reference signal power level, the first quadrature signal QS1 rises to the binary level of 1 (high). QS1 rose to the binary level 1 (71) in the middle of the first quarter 61 and remained there until mid third quarter 65. Likewise, the second quadrature signal QS2, rises to the binary level of 1 (high) when the output of the third photodetector is determined to be greater than the reference signal by second comparator 33. This occurred as shown in the middle of the second quarter 63 and lasted until mid fourth quarter 67.

The pulse rate of the first and second quadrature signals is indicative of the linear or rotary motions of the raster, while the relative phase is indicative of the raster direction. Regarding phase and the present example, QS1 precedes QS2 (as depicted in FIG. 4) and therefore the raster is moving in the direction A as Indicated in FIG. 1. Had QS2 preceded QS1, then the raster would have been moving in the opposite direction to A. QS1 and QS2 are ninety degrees out of phase. Had the light intensity dropped by a factor of two, the reference signal as well as output signals of the first and third photodetectors all drop accordingly. As such, the comparators will still detect transition points of the photodetector outputs overtaking and falling below the reference signal at the same times. Therefore, the quadrature signals QS1 and QS2 are independent of optical power fluctuations. Finally, the divider 34 may be replaced by other signal lowering means sufficient to lower the reference signal to a desired level whereby the outputs of the first and third photodetectors could exceed the reference signal level.

The invention being thus described, it will be obvious that the same may be varied in many ways. Such variations are not to be regarded as a departure from the spirit and scope of the invention, and all such modifications would be obvious to one skilled in the art intended to be included within the scope of the following claims.

We claim:

1. An optical encoder comprising:

light emitting means for generating light;

a raster for modulating said generated light, said raster comprising a plurality of periodically positioned first and second formations, said first formations being opaque and said second formations being transparent, and said raster being attached to a moving element;

light detection means for detecting light modulated by said raster, said light detection means comprising at least one set of three light detecting elements having light receiving areas being positioned in parallel to said raster, said elements generating an output responsive to detected light; and evaluating means electrically coupled to said detecting elements, said evaluating means comprising:

evaluating elements for receiving said output generated by said light detecting elements and generating an at least one quadrature signal indicative of speed and direction of said moving element;

an adder having at least two adder inputs and one adder output, said adder adding input signals received at said two adder inputs and generating a signal, and transmitting said signal along said adder output;

a divider electrically connected to said adder output, said divider comprising at least one divider input and at least one divider output, said divider receiving said adder output, reducing said adder output by a factor, generating a divider output signal representative of said reduced adder output, and transmitting said divider output signal along said divider output; and at least two comparators electrically connected to said divider, said comparators having two comparator inputs for receiving said divider output signal and a light detecting element output, and said comparators generating a first and a second quadrature signals;

wherein said input signals added by said adder are generated by a first and a third light detecting elements, and said outputs generated by said light detecting element received by said comparators are generated by said first and a second light detecting elements.

2. The optical encoder according to claim 1, wherein said light detecting elements each comprise at least one light receiving area, said light receiving areas being positioned in parallel to said raster and said light detecting elements cover a combined length of one half to one period of said raster.

3. The optical encoder according to claim 2, wherein said combined length is approximately three quarters of the period of said raster.

4. The optical encoder according to claim 1, wherein said second formations comprise openings in said raster and said first and second formations are in parallel.

5. The optical encoder according to claim 1, wherein said light emitting means further comprise a plurality of optical waveguides having first and second ends, said first ends being optically bundled to a light emitting source and said second ends being positioned proximate to said raster.

6. The optical encoder according to claim 5, wherein said light emitting means comprises a light emitting diode and lens, whereby light from said diode is focused by said lens into said optical waveguides.

7. The optical encoder according to claim 5, wherein said light emitting means comprises a vertical resonator light emission installation.

8. The apparatus according to claim 1, wherein said light detecting means comprises a photodiode.

9. The optical encoder according to claim 1, wherein output from said first light detecting element is inverse to output from said third light detecting element.

10. The optical encoder according to claim 9, wherein said divider has a dividing factor of 2.

11. The optical encoder according to claim 1, wherein the light detection means and evaluating means are semiconductor components built on a single substrate.

12. An optical encoder comprising:

light emitting means for generating light;

a raster for modulating said generated light, said raster comprising a plurality of first and second formations, said first formations being opaque and said second formations being transparent, and said raster being attached to a moving element;

light detection means for detecting light modulated by said raster, said light detection means comprising at least one set of three light detecting elements, said elements generating an output responsive to detected light, each of said elements comprise at least one light receiving area, said light receiving areas being positioned in parallel to said raster and said light detecting elements cover a combined length of one half to one period of said raster; and evaluating means electrically coupled to said detecting elements, said evaluating means comprising:

evaluating elements for receiving said output generated by said light detecting elements and generating at least one quadrature signal indicative of speed and direction of said moving element;

an adder having at least two adder inputs and one adder output, said adder adding input signals received at said two adder inputs and generating a signal, and transmitting said signal along said adder output;

a divider electrically connected to said adder output, said divider comprising at least one divider input and at least one divider output, said divider receiving said output, reducing said adder output by a factor, generating a divider output signal representative of said reduced adder output, and transmitting said divider output signal along said divider output; and at least two comparators electrically connected to said divider, said comparators having two comparator inputs for receiving said divider output signal and a light detecting element output, and said comparators generating a first and a second quadrature signals;

wherein said adding input signals are generated by a first and a third light detecting elements, and said outputs generated by said light detecting elements received by said comparators are generated by said first and a second light detecting elements.

13. The optical encoder according to claim 12, wherein said combined length is approximately three quarters of the period of said raster.

14. The optical encoder according to claim 12, wherein output from a first light detecting element is inverse to output from a third light detecting element.

15. The optical encoder according to claim 14, wherein said divider has a dividing factor of 2.

16. The optical encoder according to claim 12, wherein the light detection means and evaluating means are semiconductor components built on a single substrate.

17. An optical encoder comprising:

light emitting means for generating light;

a raster for modulating said generated light, said raster comprising a plurality of periodically positioned first and second formations, said first formations being opaque and said second formations being transparent, and said raster being attached to a moving element;

light detection means for detecting light modulated by said raster, said light detection means comprising at least one set of three light detecting elements being positioned in a linear arrangement, said elements generating an output responsive to detected light; and evaluating means electrically coupled to said detecting elements, said evaluating means comprising:

evaluating elements for receiving said output generated by said light detecting elements and generating at least one quadrature signal indicative of speed and direction of said moving element;

an adder having at least two adder inputs and one adder output, said adder adding input signals received at said two adder inputs and generating a signal, and transmitting said signal along said adder output;

a divider electrically connected to said adder output, said divider comprising at least one divider input and at least one divider output, said divider receiving said adder output, reducing said adder output by a factor, generating a divider output signal representative of said reduced adder output, and transmitting said divider output signal along said divider output; and at least two comparators electrically connected to said divider, said comparators having two comparator inputs for receiving said divider output signal and a light detecting element output, and said comparators generating a first and a second quadrature signals;

wherein said input signals added by said adder are generated by a first and a third light detecting elements, and said outputs generated by said light detecting elements received by said comparators are generated by said first and a second light detecting elements.

18. The optical encoder according to claim 17, wherein said at least one set of three light detecting elements is arranged on a single substrate.

* * * * *